United States Patent
Jagannathan et al.

(10) Patent No.: US 9,559,671 B1
(45) Date of Patent: Jan. 31, 2017

(54) DEVICES AND METHODS WITH CAPACITIVE STORAGE FOR LATCH REDUNDANCY

(71) Applicant: FREESCALE SEMICONDUCTOR, INC., Austin, TX (US)

(72) Inventors: Srikanth Jagannathan, Austin, TX (US); Nihaar N. Mahatme, Austin, TX (US); Kumar Abhishek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/972,350

(22) Filed: Dec. 17, 2015

(51) Int. Cl.
  *H03K 3/289* (2006.01)
  *H03K 3/037* (2006.01)
  *H03K 17/687* (2006.01)

(52) U.S. Cl.
  CPC ........ *H03K 3/0372* (2013.01); *H03K 17/6872* (2013.01)

(58) Field of Classification Search
  None
  See application file for complete search history.

(56) References Cited

U.S. PATENT DOCUMENTS

| | | | | |
|---|---|---|---|---|
| 4,843,254 A * | 6/1989 | Motegi | ............... | H03K 3/35625 326/97 |
| 5,028,814 A * | 7/1991 | Sung | ..................... | H03K 3/037 327/203 |
| 5,612,632 A * | 3/1997 | Mahant-Shetti | ....... | H03K 3/037 326/46 |
| 6,407,604 B1 * | 6/2002 | Takahashi | .............. | H03K 3/012 327/203 |
| 6,483,363 B1 * | 11/2002 | Karnik | ................. | H03K 3/0375 327/210 |
| 6,504,412 B1 * | 1/2003 | Vangal | ............. | H03K 3/356191 327/203 |
| 7,482,831 B2 | 1/2009 | Chakraborty et al. | | |
| 8,717,829 B2 | 5/2014 | Sharma et al. | | |
| 8,723,548 B2 | 5/2014 | Chandrasekharan et al. | | |
| 2004/0085798 A1 * | 5/2004 | Yokozeki | ............... | G11C 14/00 365/145 |
| 2004/0085846 A1 * | 5/2004 | Yokozeki | ............... | G11C 14/00 365/226 |

(Continued)

OTHER PUBLICATIONS

Calin et al, "Upset hardened memory design for submicron CMOS technology", IEEE Transactions on Nuclear Science, Dec. 1996, pp. 2874-2878, vol. 43, Issue: 6.

(Continued)

*Primary Examiner* — Cassandra Cox

(57) ABSTRACT

A master slave storage circuit can include a first master portion coupled to a first master data storage node and a first slave portion coupled to a first slave data storage node. The first master portion can comprise one of a first master latch or a first master capacitive element coupled to the first master data storage node and the first slave portion comprises one of a first slave latch or a first slave capacitive element coupled to the first slave data storage node. If the first master portion comprises the first master latch, the first slave portion comprises the first slave capacitive element, and if the first master portion comprises the first master capacitive element, the first slave portion comprises the first slave latch.

19 Claims, 7 Drawing Sheets

(56) References Cited

U.S. PATENT DOCUMENTS

2006/0168489 A1* 7/2006 Mitra ............. G01R 31/318541
714/724
2014/0286076 A1* 9/2014 Aoki ........................ G11C 5/06
365/72

OTHER PUBLICATIONS

Jagannathan et al, "Single-Event Tolerant Flip-Flop Design in 40-nm Bulk CMOS Technology", IEEE Transactions on Nuclear Science, Nov. 10, 2011, pp. 3033-3037, vol. 58, Issue: 6.
Zhang et al, "Sequential Element Design With Built-In Soft Error Resilience", IEEE Transactions on Very Large Scale Integration (VLSI) Systems, Dec. 2006, pp. 1368-1378, vol. 14, Issue: 12.

\* cited by examiner

DEVICES AND METHODS WITH CAPACITIVE STORAGE FOR LATCH REDUNDANCY

BACKGROUND

Field of the Disclosure

The present disclosure relates in general to semiconductor devices, and more specifically to capacitive storage for latch redundancy.

Description of the Related Art

As transistors dimensions shrink to enable smaller electronic devices, the possibility of failures induced by soft errors and/or single event upset (SEU) increases. SEU can occur, for example, when external energy (such as energy due to radiation particle bombardment) is imparted onto the circuit, causing values in a latch, memory, voltage detectors and/or other devices, to change to erroneous values. Therefore, as device geometries continue to shrink, redundancy becomes increasingly important. Additionally, it is important to reduce power and area consumed by redundant circuitry so that energy costs are reduced and portable devices can be made smaller and operate for longer time periods between battery recharges.

BRIEF DESCRIPTION OF THE DRAWINGS

The benefits, features, and advantages of the present disclosure will become better understood with regard to the following description, and accompanying drawings where.

DETAILED DESCRIPTION

Embodiments of devices and methods disclosed herein provide master-slave latch circuits capable of outputting the original stored data even after a radiation particle strike changes the data being stored in one or the other of a master or slave latch. In some embodiments capacitors and latches are used to form a main and redundant master slave storage circuits. The outputs of the main and redundant storage elements are compared using a Muller gate. A particle strike can affect either a main storage element or a redundant storage element resulting in high-impedance state of the Muller gate. A Muller gate in a high impedance state allows a keeper circuit to maintain the original value of the stored data output thus keeping the system unaffected as before the strike. An added advantage is that area and power usage is much less than solutions that include double or triple redundancy of the latch circuits.

Figure 1:
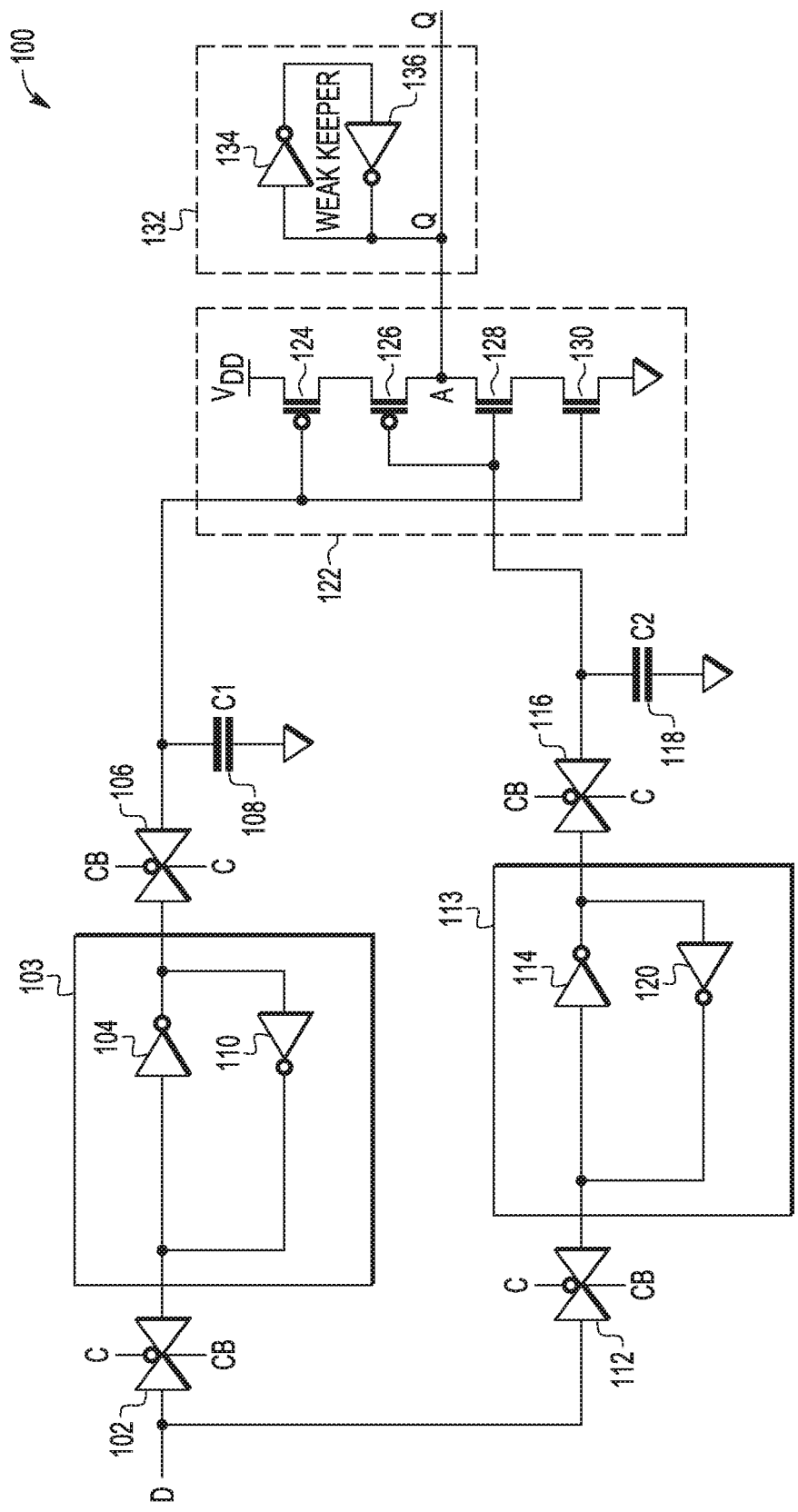
FIG. 1 illustrates a schematic diagram of a master-slave storage circuit according to one embodiment of the present invention.

FIG. 1 illustrates a schematic diagram of a master-slave storage circuit 100 according to an embodiment of the present invention that includes switches 102, 106, 112, 116, first master latch 103 with inverters 104, 110, second master latch 113 with inverters 114, 120, capacitors 108, 118, Muller gate 122, and keeper circuit 132. Muller gate 122 includes P-channel transistors 124, 126 and N-channel transistors 128, 130. Keeper circuit 132 includes inverters 134, 136. Switch 102 is operated by a clock signal and has a first terminal coupled to a data input and a second terminal coupled to an input of inverter 104. Switch 102 is open when the clock signal is high and closed when the clock signal is low. An output of inverter 104 is coupled to an input of inverter 110 and to a first terminal of switch 106. An output of inverter 110 is coupled to the input of inverter 104. A second terminal of switch 106 is coupled to a first terminal of capacitor 108 and to the gates of P-channel transistor 124 and N-channel transistor 130. A second terminal of capacitor 108 is coupled to ground. Switch 106 is closed when the clock signal is high and open when the clock signal is low.

For the second master latch 113, switch 112 is operated by the clock signal and has a first terminal coupled to the data input and a second terminal coupled to an input of inverter 114. Switch 112 is open when the clock signal is high and closed when the clock signal is low. An output of inverter 114 is coupled to an input of inverter 120 and to a first terminal of switch 116. An output of inverter 120 is coupled to the input of inverter 114. A second terminal of switch 116 is coupled to a first terminal of capacitor 118 and to the gates of P-channel transistor 126 and N-channel transistor 128. A second terminal of capacitor 118 is coupled to ground. Switch 116 is closed when the clock signal is high and open when the clock signal is low.

With respect to Muller gate 122, P-channel transistor 124 includes a first current electrode coupled to a supply voltage VDD, a second current electrode coupled to a first current electrode of P-channel transistor 126, and a control electrode coupled to the first terminal of capacitor 108 and the second terminal of switch 106. P-channel transistor 126 further includes a second current electrode coupled to a first current electrode of N-channel transistor 128 and a control electrode coupled to the first terminal of capacitor 118 and the second terminal of switch 116. N-channel transistor 128 further includes a second current electrode coupled to a first current electrode of N-channel transistor 130 and a control electrode coupled to the first terminal of capacitor 118 and the second terminal of switch 116. N-channel transistor 130 further includes a second current electrode coupled to ground and a control electrode coupled to the first terminal of capacitor 108 and the second terminal of switch 106.

Keeper circuit 132 includes an output of inverter 134 coupled to an input of inverter 136. An output of inverter 136 is coupled to an input to inverter 134 and an output node Q. Node A is coupled between the second current electrode of P-channel transistor 126 and the first current electrode of N-channel transistor 128, and node Q is connected to node A by an electrically conductive trace. The drive strength of transistors 124-130 in Muller gate 122 are sized with a drive strength that is greater than the drive strength of transistors in inverters 134 and 136 of keeper circuit 132. In selected embodiments, the drive strength of transistors 124-130 is 1.5 to 2.5 times greater than the drive strength of transistors in inverters 134 and 136. Muller gate 122 outputs a logic level high when the inputs to the control electrodes of transistors 124-130 are low, a logic level low when the inputs to the control electrodes of transistors 124-130 are high, and is at high impedance when the inputs to the control electrodes of transistors 124, 130 and 126, 128 are not equal so that the previous stored state of the master slave storage circuit 100 is stored in keeper circuit 132 and hence the output Q of the master slave storage circuit 100.

Figure 2:
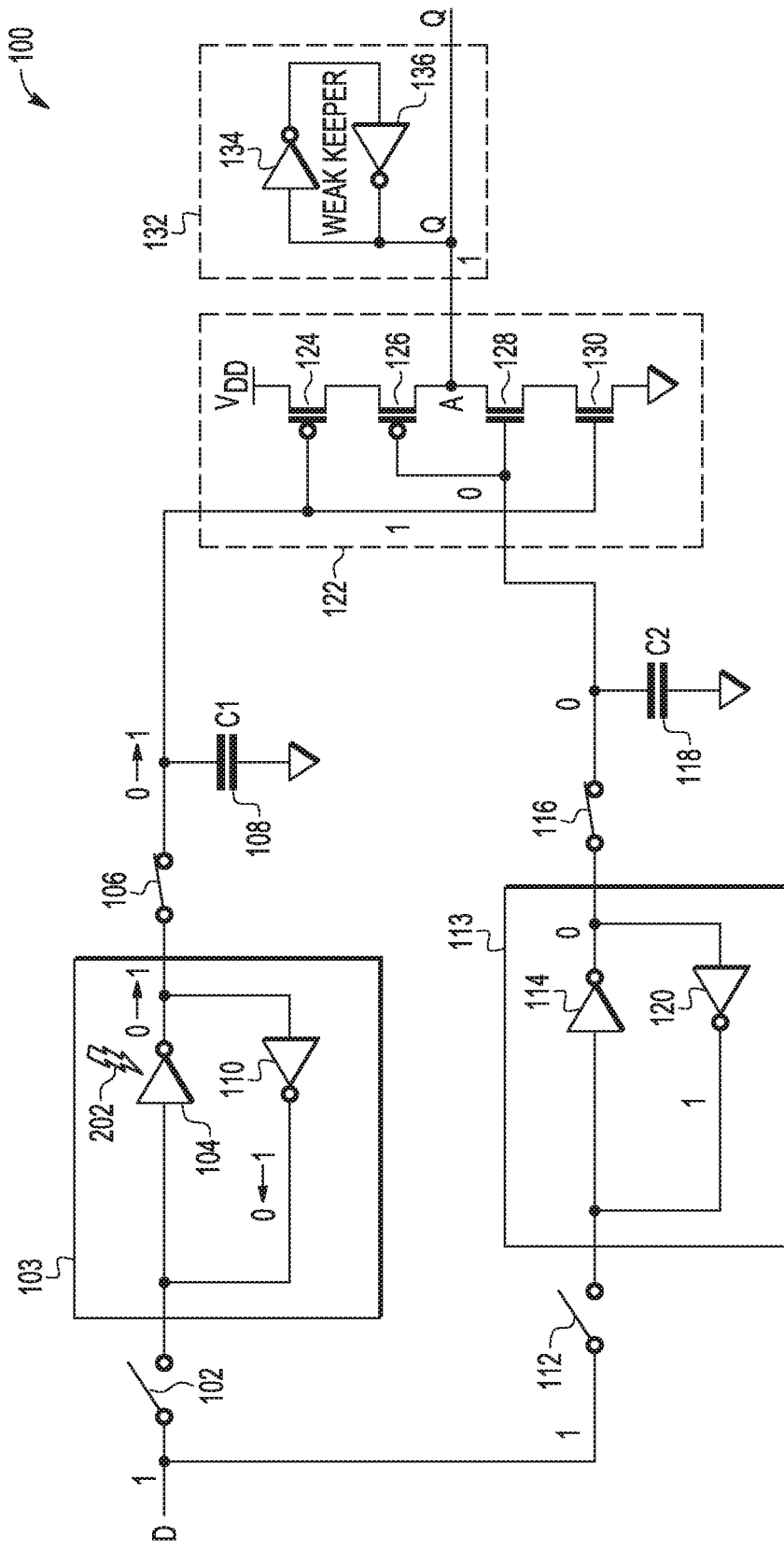
FIG. 2 illustrates a schematic diagram of the master-slave storage circuit in FIG. 1 during a first mode of operation.

The operation of master-slave storage circuit 100 will now be described with reference to FIGS. 2 and 3. FIG. 2 illustrates a schematic diagram of master-slave storage circuit 100 in FIG. 1 during a first mode of operation when the clock signal is high and a radiation particle strike 202 on inverter 104 of first master latch 103 occurs. Switches 102, 112 are open and switches 106 and 116 are closed. The radiation particle strike 202 causes the state of first master latch 103 to change with the data stored at the output of inverter 104 changing from a "0" to "1" and the data stored at the output of inverter 110 changing from "1" to "0". Capacitor 108 is charged, P-channel transistor 124 is placed in a non-conductive state and N-channel transistor 130 is placed in a conductive state. Second master latch 113 continues to store a "0", and capacitor 118 is discharged, which causes P-channel transistor 126 to be placed in a conductive state and N-channel transistor 128 to be placed in in a non-conductive state. Although node A of Muller gate 122 is in a high impedance state, keeper circuit 132 maintains the previous value of output node Q as high, which is the output of master-slave storage circuit 100. Thus, the radiation particle strike 202 does not change the data output by master-slave storage circuit 100.

Figure 3:
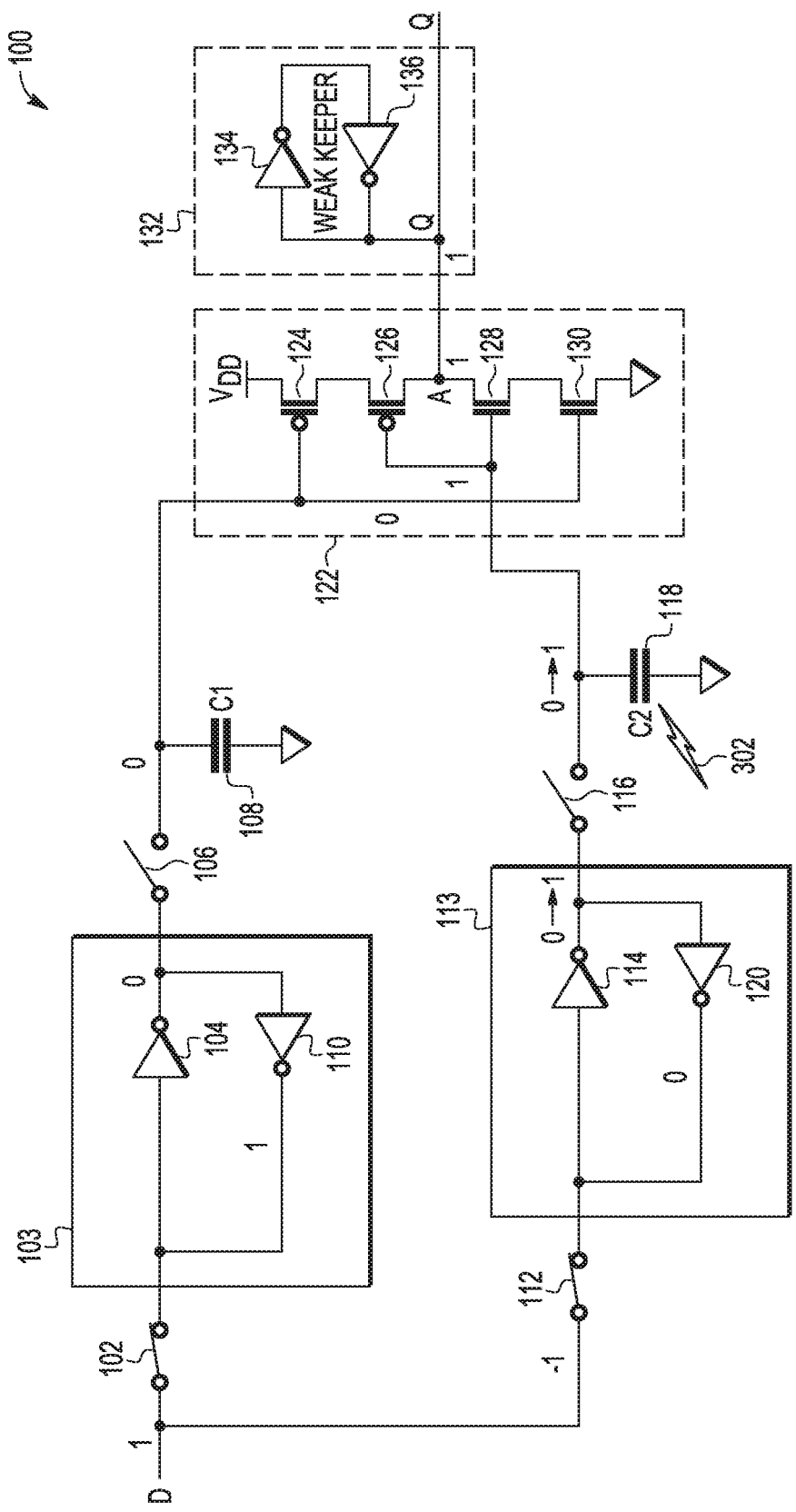
FIG. 3 illustrates a schematic diagram of the master-slave storage circuit in FIG. 1 during a second mode of operation.

FIG. 3 illustrates a schematic diagram of the master-slave storage circuit 100 in FIG. 1 during a second mode of operation when the clock signal is low and a radiation particle strike 302 on capacitor 118 occurs. Switches 102, 112 are closed and switches 106 and 116 are open. The radiation particle strike 302 causes the state of capacitor 118 to change from a "0" to "1" while capacitor 108 continues to store a "0". The first master latch 103 continues to be transparent to data input. As a result, P-channel transistor 126 and N-channel transistor 130 are placed in a non-conductive state and P-channel transistor 124 and N-channel transistor 128 are placed in a conductive state, placing node A in a high impedance state. The value of output node Q is retained high by keeper circuit 132. Thus, the radiation particle strike 302 on capacitor 118 does not change the data output by master-slave storage circuit 100 even though the data stored in capacitor 118 was changed.

Figure 4:
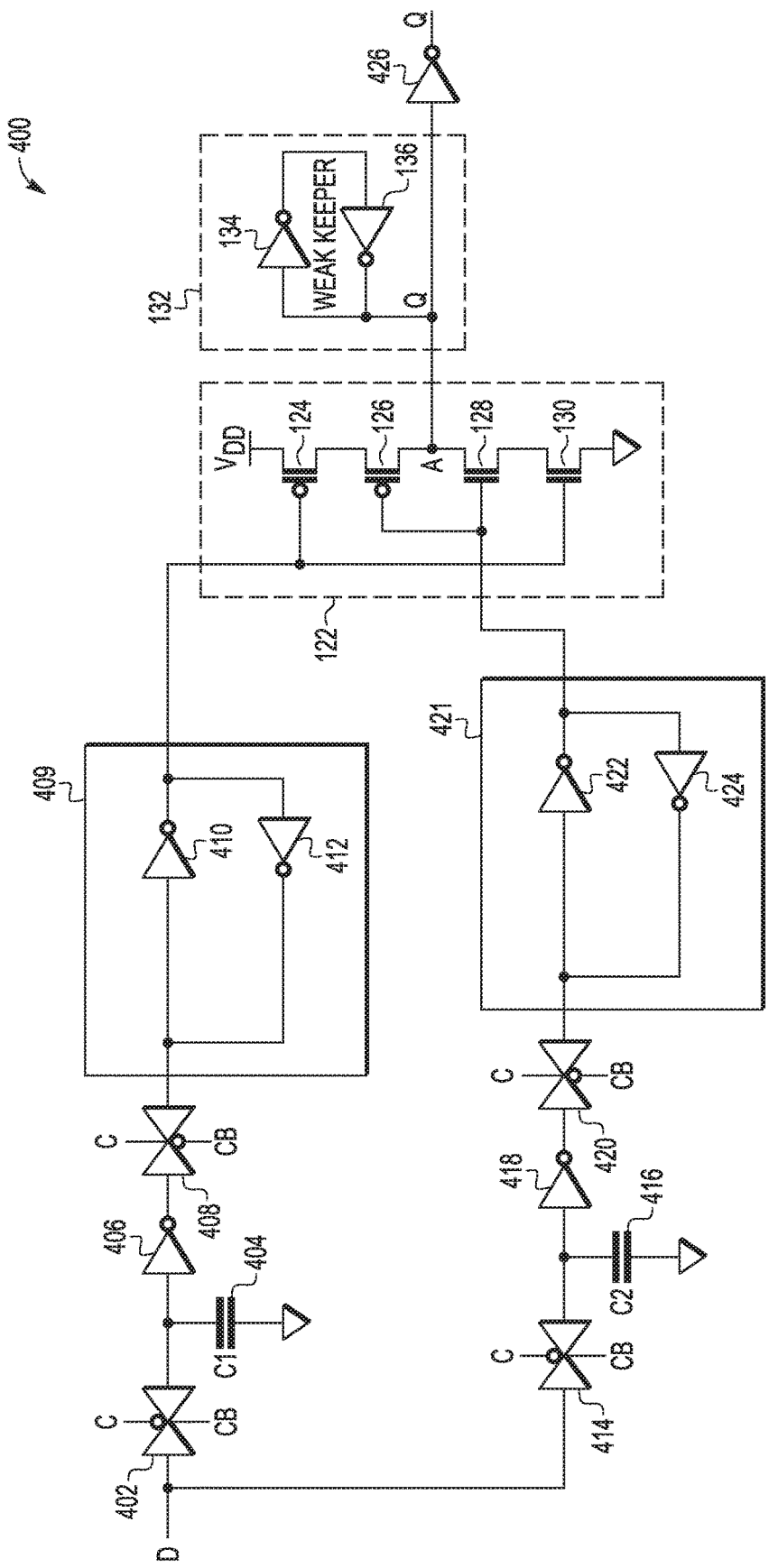
FIG. 4 illustrates a schematic diagram of a master-slave storage circuit according to another embodiment of the present invention.

FIG. 4 illustrates a schematic diagram of a master-slave storage circuit 400 according to another embodiment of the present invention that includes switches 402, 408, 414, 420, capacitors 404, 416, inverters 406, 418, first slave latch 409 with inverters 410, 412, second slave latch 421 with inverters 422, 424, Muller gate 122, and keeper circuit 132. Muller gate 122 and keeper circuit 132 are similar to those shown in FIGS. 1-3. For the first slave latch 409, switch 402 is operated by a clock signal and has a first terminal coupled to a data input and a second terminal coupled to a first terminal of capacitor 404 and an input of inverter 406. Switch 402 is open when the clock signal is high and closed when the clock signal is low. A second terminal of capacitor 404 is coupled to ground. An output of inverter 406 is coupled to an input to switch 408. An output of switch 408 is coupled to an input of inverter 410. Switch 408 is closed when the clock signal is high and open when the clock signal is low. An output of inverter 410 is coupled to an input of inverter 412 and to the control electrodes of P-channel transistor 124 and N-channel transistor 130. An output of inverter 412 is coupled to the input of inverter 410.

For the second slave latch 421, switch 414 is operated by a clock signal and has a first terminal coupled to a data input and a second terminal coupled to a first terminal of capacitor 416 and an input of inverter 418. Switch 414 is open when the clock signal is high and closed when the clock signal is low. A second terminal of capacitor 416 is coupled to ground. An output of inverter 418 is coupled to an input to switch 420. An output of switch 420 is coupled to an input of inverter 422. Switch 420 is closed when the clock signal is high and open when the clock signal is low. An output of inverter 422 is coupled to an input of inverter 424 and to the control electrodes of P-channel transistor 126 and N-channel transistor 128. An output of inverter 424 is coupled to the input of inverter 422.

During operation, if a particle strike occurs on inverter 410 while the clock signal is low, switches 402 and 414 will be closed and switches 408 and 420 will be open. If data input is low or "0", capacitor 404 will be discharged and the output of inverter 406 will be high or a "1". With switch 408 open, consider input to inverter 410 is low or "0" and output is "1", but output of inverter 410 changes to "0" due to the radiation particle strike. P-channel transistor 124 will be in a conductive state and N-channel transistor 130 will be in a non-conductive state. With regard to second slave latch 421, since data input is low or "0", capacitor 416 will be discharged and the output of inverter 418 will be high or a "1". With switch 420 open, consider input to inverter 421 is low or "0", and the output of latch 421 is latched high. P-channel transistor 126 will be in a non-conductive state and N-channel transistor 128 will be in a conductive state. Node A will be in a high impedance state, and the data "0" retained by keeper circuit 132 will be output at node Q even though latch 409 outputs data "0" due to the radiation particle strike. A particle strike on either inverter 422 or 424 also will not change the data output by master-slave flip-flop 400 since Muller gate 122 will be in a high impedance state and the original output will be retained by keeper circuit 132.

Figure 5:
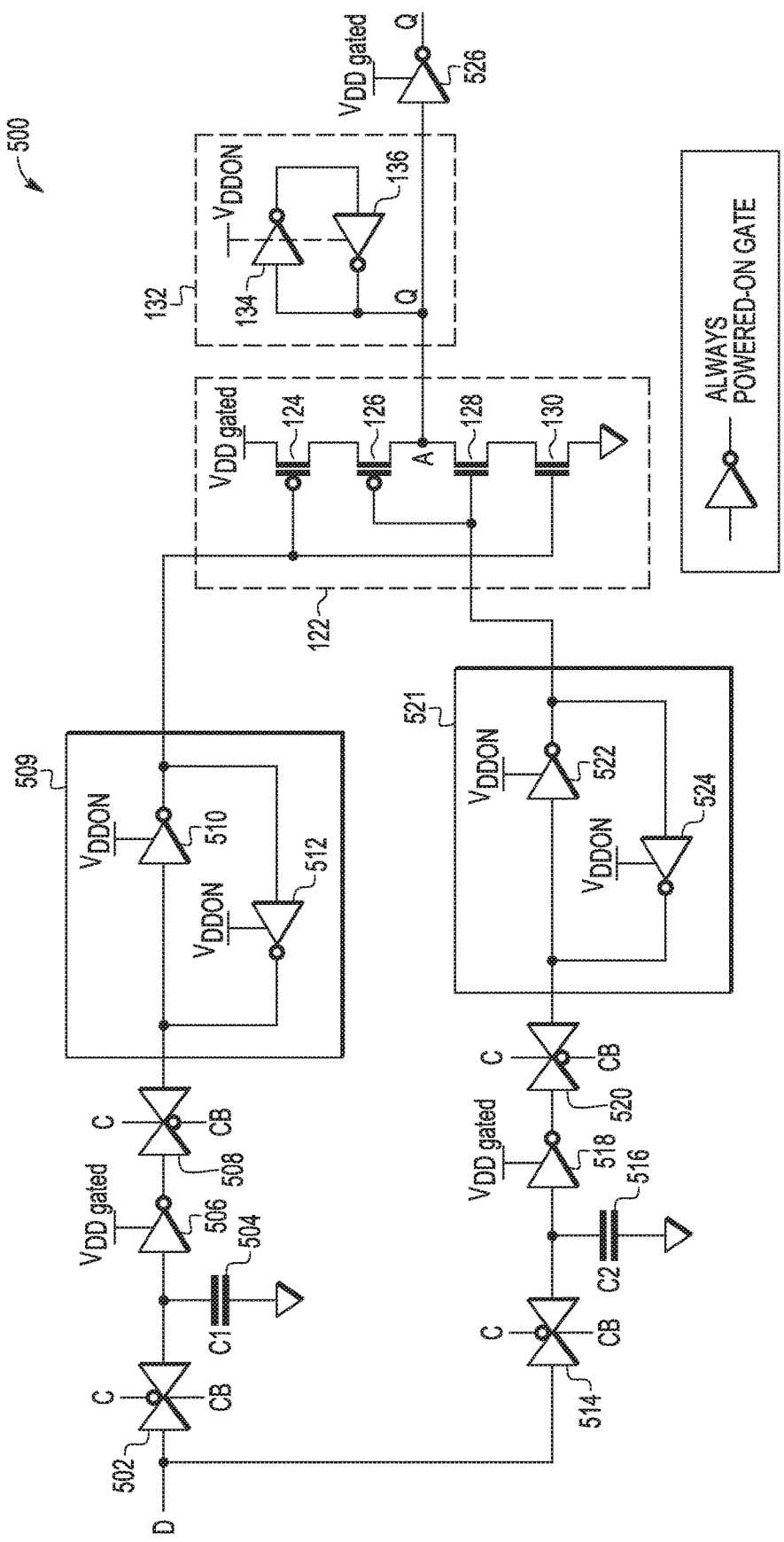
FIG. 5 illustrates a schematic diagram of a master-slave storage circuit according to another embodiment of the present invention.

Power gating is a technique used to conserve power by cutting power to circuit elements that are not in use. FIG. 5 illustrates a schematic diagram of a master-slave storage circuit 500 with power gating according to another embodiment of the present invention that includes switches 502, 508, 514, 520, capacitors 504, 516, power gated inverters 506, 518, 526, first master latch 509 with inverters 510, 512, second master latch 521 with inverters 522, 524, Muller gate 122, and keeper circuit 132. Muller gate 122 and keeper circuit 132 are similar to those shown in FIGS. 1-3 except that transistors 124-130 are power gated. For the first master latch 509, switch 502 is operated by the clock signal and has a first terminal coupled to a data input and a second terminal coupled to a first terminal of capacitor 504 and an input of inverter 506. Switch 502 is open when the clock signal is high and closed when the clock signal is low. A second terminal of capacitor 504 is coupled to ground. An output of inverter 506 is coupled to an input to switch 508. An output of switch 508 is coupled to an input of inverter 510. Switch 508 is closed when the clock signal is high and open when the clock signal is low. An output of inverter 510 is coupled to an input of inverter 512 and to the control electrodes of P-channel transistor 124 and N-channel transistor 130. An output of inverter 512 is coupled to the input of inverter 510.

For the second master latch 521, switch 514 is operated by the clock signal and has a first terminal coupled to a data input and a second terminal coupled to a first terminal of capacitor 516 and an input of inverter 518. Switch 514 is open when the clock signal is high and closed when the clock signal is low. A second terminal of capacitor 516 is coupled to ground. An output of inverter 518 is coupled to an input to switch 520. An output of switch 520 is coupled to an input of inverter 522. Switch 520 is closed when the clock signal is high and open when the clock signal is low. An output of inverter 522 is coupled to an input of inverter 524 and to the control electrodes of P-channel transistor 126 and N-channel transistor 128. An output of inverter 524 is coupled to the input of inverter 522.

During operation, power is always supplied to inverters 510, 512, 522, 524, 134, 136 even though some of the other components are power gated. If a particle strike occurs on inverter 510 while the clock signal is low, switches 502 and 514 will be closed and switches 508 and 520 will be open. With switch 508 open, considering input to inverter 510 is low or "0", but the state of inverter 510 changes to "1" due to the radiation particle strike. The output of inverter 512 changes from "1" to "0". P-channel transistor 124 will be in a non-conductive state and N-channel transistor 130 will be in a conductive state. With regard to second slave latch 521, since data input is low or "0", capacitor 516 will be discharged and the output of inverter 518 will be high or a "1". With switch 520 open, considering input to inverter 522 is low or "0", and the output of latch 521 is high. P-channel transistor 126 will be in a non-conductive state and N-channel transistor 128 will be in a conductive state. Node A will be in a high impedance state, and the data "0" retained by keeper circuit 132 will be output at node Q even though latch 509 outputs data "1" due to the radiation particle strike. A particle strike on any of inverters 512, 522 or 524 also will not change the data output by master-slave flip-flop 500 since Muller gate 122 will be in a high impedance state and the original output will be retained by keeper circuit 132.

Figure 6:
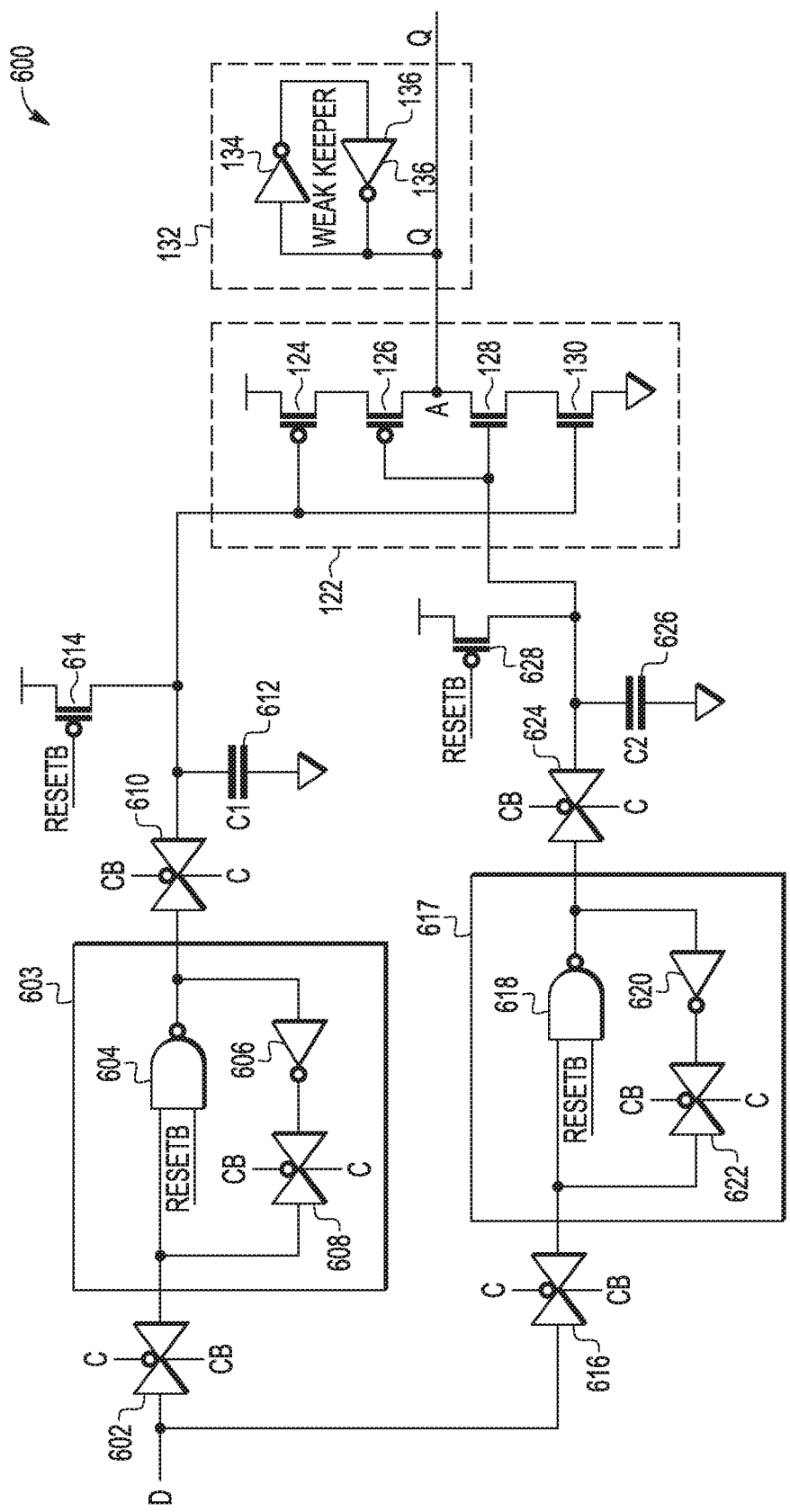
FIG. 6 illustrates a schematic diagram of a master-slave storage circuit according to another embodiment of the present invention.

A reset type of flip-flop is triggered to a low state by setting an input RESETB low. The output value is retained even when RESETB signal goes high. FIG. 6 illustrates a schematic diagram of a reset master-slave storage circuit according to another embodiment of the present invention that includes switches 602, 608, 610, 616, 622, 624, first master latch 603 with NAND gate 604 and inverter 606, second master latch 617 with NAND gate 618 and inverter 620, reset transistors 614, 628, capacitors 612, 626, Muller gate 122, and keeper circuit 132. In the example shown, reset transistors 614, 628 are minimum size PMOS transistors. Muller gate 122 and keeper circuit 132 are similar to those shown in FIGS. 1-3. Switch 602 is operated by the clock signal and has a first terminal coupled to a data input and a second terminal coupled to a first input of NAND gate 604. A second input of NAND gate 604 is coupled to a RESETB signal. Switch 602 is open when the clock signal is high and closed when the clock signal is low. An output of NAND gate 604 is coupled to an input of inverter 606 and to a first terminal of switch 610. An output of inverter 606 is coupled to an input of switch 608. An output of switch 608 is coupled to the first input of NAND gate 604. A second terminal of switch 610 is coupled to a first terminal of capacitor 612, a first terminal of P-channel reset transistor 614, and to the gates of P-channel transistor 124 and N-channel transistor 130. A second terminal of capacitor 612 and a second terminal of reset transistor 614 are coupled to ground and supply voltage respectively. A control electrode of transistor 614 is coupled to RESETB signal. Switch 610 is closed when the clock signal is high and open when the clock signal is low.

For the second master latch 617, switch 616 is operated by the clock signal and has a first terminal coupled to the data input and a second terminal coupled to a first input of NAND gate 618. A second input of NAND gate 618 is coupled to the RESETB signal. Switch 616 is open when the clock signal is high and closed when the clock signal is low. An output of NAND gate 618 is coupled to an input of inverter 620 and to a first terminal of switch 624. An output of inverter 620 is coupled to an input of switch 622. An output of switch 622 is coupled to the first input of NAND gate 618. A second terminal of switch 624 is coupled to a first terminal of capacitor 626, a first terminal of P-channel reset transistor 628, and to the gates of P-channel transistor 126 and N-channel transistor 128. A second terminal of capacitor 626 and a second terminal of reset transistor 628 are coupled to ground and supply respectively. A control electrode of transistor 628 is coupled to the RESETB signal. Switch 624 is closed when the clock signal is high and open when the clock signal is low.

If a radiation particle strike occurs during operation, for example a particle strike on inverter 606, switches 602, 616 are open and switches 608, 610, 622 and 624 will be closed when the clock signal is high. Data at the first inputs to NAND gates 604, 618 will be low. The radiation particle strike will cause the state of first master latch 603 to change with the data stored in inverter 606 changing from "0" to "1" and the output of NAND gate 604 will change from "1" to "0" as long as the RESETB signal is not low. Capacitor 612 will be discharged, reset transistors 614, 628 will be in a non-conductive state, P-channel transistor 124 will be in a conductive state and N-channel transistor 130 will be in a non-conductive state. Second master latch 617 continues to store a "1", and capacitor 626 is charged, which causes P-channel transistor 126 to be placed in a non-conductive state and N-channel transistor 128 to be placed in a conductive state. Although node A of Muller gate 122 is in a high impedance state, keeper circuit 132 maintains the previous value of output node Q as high, which is the output of master-slave storage circuit 100. Thus, the radiation particle strike does not change the data output by master-slave storage circuit 100.

When the RESETB signal is low, reset transistors 614, 628 are placed in a conductive state, causing capacitors 612, 626 to charge. The output at nodes A and Q will be low.

Figure 7:
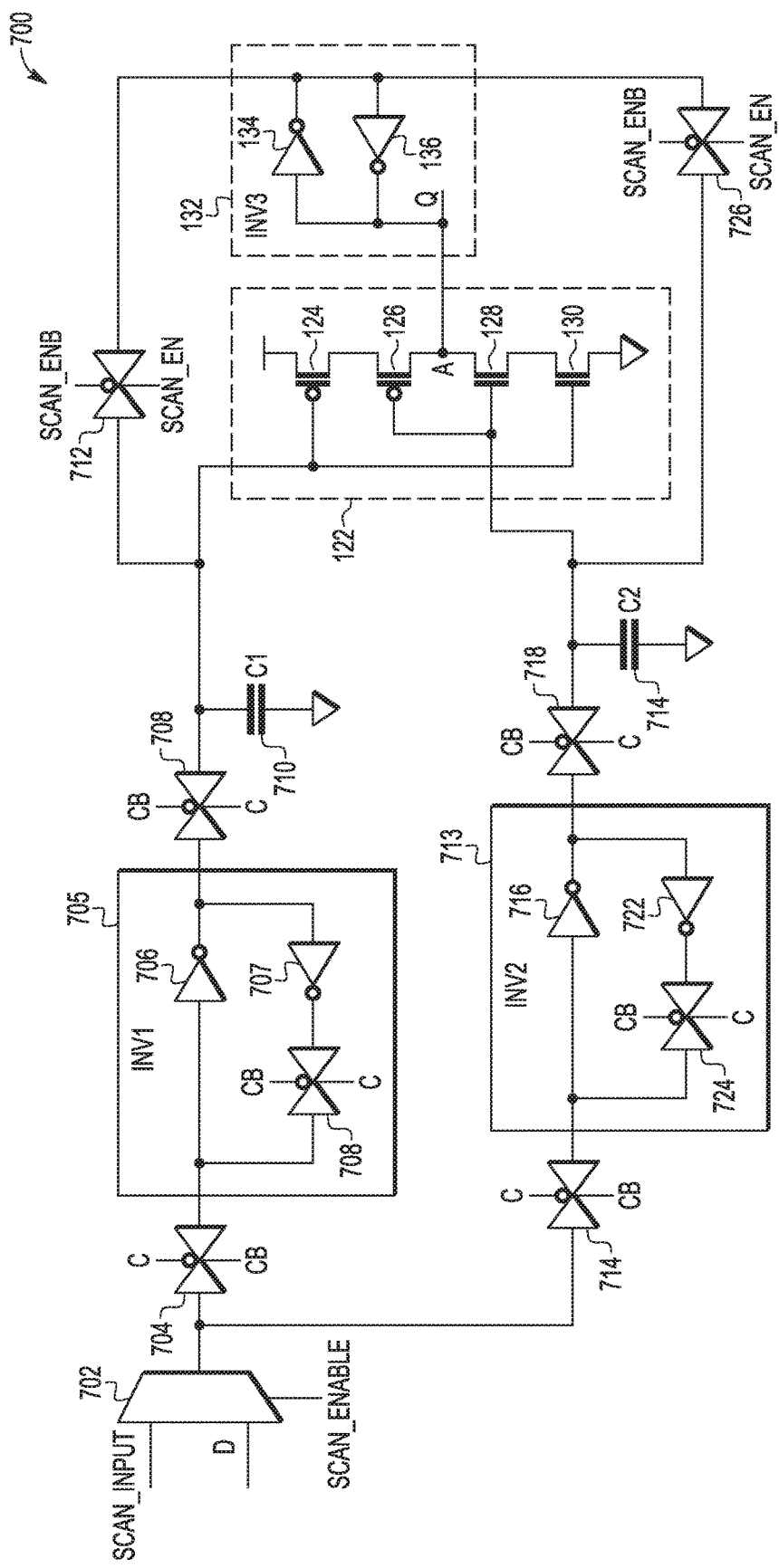
FIG. 7 illustrates a schematic diagram of a master-slave storage circuit according to another embodiment of the present invention.

Boundary scanning refers to a technique and architecture for testing circuitry without using physical test probes by adding test cells connected to pins of a device. The test cells can selectively override the functionality of the circuitry during test or debug modes to verify that proper connections are being made. Devices with boundary scan features are referred to as "scannable". FIG. 7 illustrates a schematic diagram of a scannable master-slave storage circuit 700 according to another embodiment of the present invention that includes multiplexer 702, switches 704, 709, 712, 714, 718, and 726, first master latch 705 with inverters 706, 707 and switch 708, second master latch 713 with inverters 716, 722 and switch 724, capacitors 710, 720, Muller gate 122, and keeper circuit 132. Muller gate 122 and keeper circuit 132 are similar to those shown in FIGS. 1-3. Multiplexer 702 has a first input coupled to a SCAN_INPUT signal, a second input coupled to a data signal, an output coupled to an input of switch 704, and a control input coupled to a SCAN_EN-ABLE signal. Switch 704 has a first terminal coupled to the output of multiplexer 702, and a second terminal coupled to an input of inverter 706. Switch 704 is open when the clock signal is high and closed when the clock signal is low. An output of inverter 706 is coupled to an input of inverter 707 and to a first terminal of switch 709. An output of inverter 707 is coupled to a first terminal of switch 708. A second terminal of switch 708 is coupled to the input of inverter 706. A second terminal of switch 709 is coupled to a first terminal of capacitor 710 and to the gates of P-channel transistor 124 and N-channel transistor 130. A second terminal of capacitor 710 is coupled to ground. Switches 708 and 709 are open when the clock signal is low and closed when the clock signal is high. Switch 712 includes a first terminal coupled between the first terminal of capacitor 710 and the control electrodes of transistors 124 and 130 and a second terminal coupled to the output of inverter 134 and the input of inverter 136. Switch 712 is closed when the SCAN_ENABLE signal is high and open when the SCAN_ENABLE signal is low.

For the second master latch 713, switch 714 has a first terminal coupled to the output of multiplexer 702, and a second terminal coupled to an input of inverter 716. Switch 714 is open when the clock signal is high and closed when the clock signal is low. An output of inverter 716 is coupled to an input of inverter 722 and to a first terminal of switch 718. An output of inverter 722 is coupled to a first terminal of switch 724. A second terminal of switch 724 is coupled to the input of inverter 716. A second terminal of switch 718 is coupled to a first terminal of capacitor 720 and to the gates of P-channel transistor 126 and N-channel transistor 128. A second terminal of capacitor 720 is coupled to ground. Switches 724 and 718 are open when the clock signal is low and closed when the clock signal is high. Switch 726 includes a first terminal coupled between the first terminal of capacitor 720 and the control electrodes of transistors 126 and 128 and a second terminal coupled to the output of inverter 134 and the input of inverter 136. Switch 726 is closed when the SCAN_ENABLE signal is high and open when the SCAN_ENABLE signal is low.

During operation, if a radiation particle strike occurs on inverter 706 of first master latch 705 when the clock signal is high and scan is not enabled, data is output by multiplexer 702, switches 704, 712, 714 and 726 are open and switches 708, 709, 718 and 724 are closed. The radiation particle strike causes the state of first master latch 705 to change with the data stored in inverter 706 changing from a "0" to "1" and the data stored in inverter 707 changing from "1" to "0". Capacitor 710 is charged, P-channel transistor 124 is placed in a non-conductive state and N-channel transistor 130 is placed in a conductive state. Second master latch 617 continues to store a "0", and capacitor 720 is discharged, which causes P-channel transistor 126 to be placed in a conductive state and N-channel transistor 128 to be placed in a non-conductive state. Although node A of Muller gate 122 is in a high impedance state, keeper circuit 132 maintains the previous value of output node Q as high, which is the output of master-slave storage circuit 700. Thus, the radiation particle strike does not change the data output by master-slave storage circuit 100.

A minimum clock frequency for functional mode of master-slave storage circuit 700 is required to retain the charge on capacitors 710, 720 since switches 712, 726 are open when scan is not enabled, and capacitors 710, 720 do not receive feedback from keeper circuit 132. Since scan frequency is typically lower, capacitors 710, 720 are coupled to the output of keeper circuit 132 when scan is enabled by closing switches 712 and 726. When the clock signal is low, capacitors 710 and 720 are no longer floating but are driven by the output of keeper circuit 132. When the clock signal is high, the size of inverters 706 and 716 are sized to overpower inverter 134 and 136 of keeper circuit 132.

By now it should be appreciated that in some embodiments, a master slave storage circuit can comprise a first master portion coupled to a first master data storage node; and a first slave portion coupled to a first slave data storage node. The first master portion can comprise one of a first master latch or a first master capacitive element coupled to the first master data storage node and the first slave portion comprises one of a first slave latch or a first slave capacitive element coupled to the first slave data storage node. If the first master portion comprises the first master latch, the first slave portion comprises the first slave capacitive element, and if the first master portion comprises the first master capacitive element, the first slave portion comprises the first slave latch.

In another aspect, the master slave storage circuit can further comprise a second master portion coupled to a second master data storage node; and a second slave portion coupled to a second slave data storage node, wherein the second master portion comprises one of a second master latch or a second master capacitive element coupled to the second master data storage node and the second slave portion comprises one of a second slave latch or a second slave capacitive element coupled to the second slave data storage node. If the second master portion comprises the second master latch, the slave portion comprises the second slave capacitive element, and if the second master portion comprises the second master capacitive element, the second slave portion comprises the second slave latch.

In another aspect, the master slave storage circuit can further comprise a Muller gate (122) having a first input coupled to the first slave storage node, a second input coupled to one of the second slave storage node, and an output coupled to an output of the master slave storage circuitry.

In another aspect, the Muller gate can be configured to output a logic level high when the first and second inputs are at a first logic state, a logic level low when the first and second inputs are at a second logic state different from the first logic state, and a previous stored state of the master slave storage circuit when the first and second inputs are at different logic states.

In another aspect, the master slave storage circuit can further comprise a keeper circuit having an input node coupled to the output node of the Muller gate.

In another aspect, the Muller gate can comprise a stronger drive strength than the keeper circuit.

In another aspect, the master slave storage circuit can further comprise a first switch (102) coupled to an input of the master slave storage circuit, a second switch (106) coupled between the first master portion and the first slave portion, a third switch (112) coupled to an input of the master slave storage circuit, and a fourth switch (116) coupled between the second master portion and the second slave portion. The first switch and third switches can be configured to be closed during a first phase of a clock signal and open during a second phase of the clock signal, and wherein the second and fourth switches are configured to be open during the first phase of the clock signal and closed during the second phase of the clock signal.

In another aspect, the master slave storage circuit can further comprise a first switch coupled to an input of the master slave storage circuit, and a second switch coupled between the first master portion and the first slave portion. The first switch and second switch are closed during opposite phases of a clock signal In another aspect, the master slave storage circuit can further comprise a pullup transistor coupled to the first master capacitive element or the first slave capacitive element having a control electrode coupled to receive a reset signal, and a logic gate having a first input coupled to an input of the first master latch or the first slave latch, a second input coupled to receive the reset signal, and an output coupled to an output of the first master latch or the first slave latch.

In another embodiment, a master slave storage circuit can comprise a first master portion having a first master latch coupled between an input of the master slave storage circuit and a first master data storage node, a first slave portion coupled to a first slave data storage node and having a first slave capacitive element coupled to the first slave data storage node. A second master portion having a second master latch can be coupled between the input of the master slave storage circuit and a second master data storage node. A second slave portion can be coupled to a second slave data storage node and having a second slave capacitive element coupled to the second slave data storage node. During a first phase of a clock signal, the first master portion and the second master portion can be in a transparent phase and the first slave portion and the second slave are in a hold phase in which the first and second capacitive elements are configured to store states of the first and second slave storage nodes.

In another aspect, during a second phase of the clock, the first slave portion and the second slave portion can be in the transparent phase and the first master portion and the second master portion can be in the hold phase.

In another aspect, the master slave storage circuit can further comprise a first switch coupled between the input of the master slave storage circuit and the first master latch. A second switch can be coupled between the first master storage node and the first slave storage node. A third switch can be coupled between the input of the master slave storage circuit and the second master latch. A fourth switch can be coupled between the second master storage node and the second slave storage node. During the first phase of the clock signal, the first and third switches can be closed and the second and fourth switches can be open, and during a second phase of the clock signal, the first and third switches can be open and the second and fourth switches can be closed.

In another aspect, the master slave storage circuit can further comprise a Muller gate having a first input coupled to the first slave storage node, a second input coupled to the second slave storage node, and an output coupled to an output of the master slave storage circuit; and a keeper circuit having an input coupled to the output of the Muller gate.

In another aspect, the input of the master slave storage circuit can be configured to receive one of a data input or scan input. An output of the keeper circuit can be coupled via a fifth switch to the first slave storage node and via a sixth switch to the second slave storage node. During a scan mode, the input of the master slave storage circuit can be configured to receive the scan input and the fifth and sixth switches are closed.

In another aspect, the master slave storage circuit can further comprise a first pullup transistor coupled to the first slave capacitive element and having a control electrode coupled to receive a reset signal, a second pullup transistor coupled to the second slave capacitive element and having a control electrode coupled to receive the reset signal, a first logic gate having a first input coupled to an input of the first master latch, a second input coupled to receive the reset signal, and an output coupled to an output of the first master latch. A second logic gate can have a first input coupled to an input of the second master latch, a second input coupled to receive the reset signal, and an output coupled to an output of the second master latch.

In another aspect, during a power gating mode, the clock signal can be held at a logic level high.

In further embodiments, a master slave storage circuit can comprise a first master portion having a first capacitive element coupled to a first master data storage node, a first slave portion having a first slave latch coupled between the first master storage node and a first slave data storage node, a second master portion having a second capacitive element coupled to a second master data storage node, and a second slave portion having a second slave latch coupled between the second master storage node and a second slave data storage node. During a first phase of a clock signal, the first master portion and the second master portion can be in a hold phase in which the first and second capacitive elements are configured to store states of the first and second master storage nodes, and during a second phase of the clock, the first master portion and the second master portion can be in the transparent phase and the first slave portion and the second slave portion are in the hold phase.

In another aspect, the master slave storage circuit can further comprise a Muller gate having a first input coupled to the first slave storage node, a second input coupled to the second slave storage node, and an output coupled to an output of the master slave storage circuit. A keeper circuit can have an input coupled to the output of the Muller gate.

In another aspect, the master slave storage circuit can further comprise a first switch coupled between the input of the master slave storage circuit and the first capacitive element, a second switch coupled between the first master storage node and the first slave latch. A third switch can be coupled between the input of the master slave storage circuit and the second capacitive. A fourth switch can be coupled between the second master storage node and the second slave latch. During the first phase of the clock signal, the first and third switches can be closed and the second and fourth switches can be open, and during the second phase of the clock signal, the first and third switches can be open and the second and fourth switches can be closed.

In another aspect, the master slave storage circuit can further comprise a first inverter between the first capacitive element and the first master storage node; and a second inverter between the second capacitive element and the second master storage node, wherein the first and second inverters and the Muller gate are power gated elements, and the first and second slave latches and the keeper circuit are configured to receive a constant on power supply.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Master slave storage circuit 100 can be used with and/or as part of a computer system. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A master slave storage circuit comprising:
  a first master portion coupled to a first master data storage node; and
  a first slave portion coupled to a first slave data storage node, wherein the first master portion comprises one of a first master latch or a first master capacitive element coupled to the first master data storage node and the first slave portion comprises one of a first slave latch or a first slave capacitive element coupled to the first slave data storage node, wherein if the first master portion comprises the first master latch, the first slave portion comprises the first slave capacitive element, and if the first master portion comprises the first master capacitive element, the first slave portion comprises the first slave latch;
  a first switch coupled to an input of the master slave storage circuit; and
  a second switch coupled between the first master portion and the first slave portion, wherein the first switch and second switch are closed during opposite phases of a clock signal.

2. The master slave storage circuit of claim 1, further comprising:
  a second master portion coupled to a second master data storage node; and
  a second slave portion coupled to a second slave data storage node, wherein the second master portion comprises one of a second master latch or a second master capacitive element coupled to the second master data storage node and the second slave portion comprises one of a second slave latch or a second slave capacitive element coupled to the second slave data storage node, wherein if the second master portion comprises the second master latch, the slave portion comprises the second slave capacitive element, and if the second master portion comprises the second master capacitive element, the second slave portion comprises the second slave latch.

3. The master slave storage circuit of claim 2, further comprising:
  a Muller gate having a first input coupled to the first slave storage node, a second input coupled to one of the second slave storage node, and an output coupled to an output of the master slave storage circuitry.

4. The master slave storage circuit of claim 3, wherein the Muller gate is configured to output a logic level high when the first and second inputs are at a first logic state, a logic level low when the first and second inputs are at a second logic state different from the first logic state, and a previous stored state of the master slave storage circuit when the first and second inputs are at different logic states.

5. The master slave storage circuit of claim 3, further comprising:
  a keeper circuit having an input node coupled to the output node of the Muller gate.

6. The master slave storage circuit of claim 5, wherein the Muller gate comprises a stronger drive strength than the keeper circuit.

7. The master slave storage circuit of claim 5, further comprising:
  a first switch coupled to an input of the master slave storage circuit;
  a second switch coupled between the first master portion and the first slave portion;
  a third switch coupled to an input of the master slave storage circuit; and
  a fourth switch coupled between the second master portion and the second slave portion, wherein the first switch and third switches are configured to be closed during a first phase of a clock signal and open during a second phase of the clock signal, and wherein the second and fourth switches are configured to be open during the first phase of the clock signal and closed during the second phase of the clock signal.

8. The master slave storage circuit of claim 1, further comprising:
  a pullup transistor coupled to the first master capacitive element or the first slave capacitive element having a control electrode coupled to receive a reset signal; and
  a logic gate having a first input coupled to an input of the first master latch or the first slave latch, a second input coupled to receive the reset signal, and an output coupled to an output of the first master latch or the first slave latch.

9. A master slave storage circuit comprising:
a first master portion having a first master latch coupled between an input of the master slave storage circuit and a first master data storage node;
a first slave portion coupled to a first slave data storage node and having a first slave capacitive element coupled to the first slave data storage node;
a second master portion having a second master latch coupled between the input of the master slave storage circuit and a second master data storage node; and
a second slave portion coupled to a second slave data storage node and having a second slave capacitive element coupled to the second slave data storage node, wherein:
during a first phase of a clock signal, the first master portion and the second master portion are in a transparent phase and the first slave portion and the second slave are in a hold phase in which the first and second capacitive elements are configured to store states of the first and second slave storage nodes.

10. The master slave storage circuit of claim 9, wherein during a second phase of the clock, the first slave portion and the second slave portion are in the transparent phase and the first master portion and the second master portion are in the hold phase.

11. The master slave storage of claim 9, further comprising:
a first switch coupled between the input of the master slave storage circuit and the first master latch;
a second switch coupled between the first master storage node and the first slave storage node;
a third switch coupled between the input of the master slave storage circuit and the second master latch; and
a fourth switch coupled between the second master storage node and the second slave storage node, wherein, during the first phase of the clock signal, the first and third switches are closed and the second and fourth switches are open, and during a second phase of the clock signal, the first and third switches are open and the second and fourth switches are closed.

12. The master slave storage of claim 11, further comprising:
a Muller gate having a first input coupled to the first slave storage node, a second input coupled to the second slave storage node, and an output coupled to an output of the master slave storage circuit; and
a keeper circuit having an input coupled to the output of the Muller gate.

13. The master slave storage of claim 12, wherein the input of the master slave storage circuit is configured to receive one of a data input or scan input, wherein an output of the keeper circuit is coupled via a fifth switch to the first slave storage node and via a sixth switch to the second slave storage node, wherein during a scan mode, the input of the master slave storage circuit is configured to receive the scan input and the fifth and sixth switches are closed.

14. The master slave storage circuit of claim 12, further comprising:
a first pullup transistor coupled to the first slave capacitive element and having a control electrode coupled to receive a reset signal;
a second pullup transistor coupled to the second slave capacitive element and having a control electrode coupled to receive the reset signal;
a first logic gate having a first input coupled to an input of the first master latch, a second input coupled to receive the reset signal, and an output coupled to an output of the first master latch; and
a second logic gate having a first input coupled to an input of the second master latch, a second input coupled to receive the reset signal, and an output coupled to an output of the second master latch.

15. The master slave storage of claim 12, wherein during a power gating mode, the clock signal is held at a logic level high.

16. A master slave storage circuit comprising:
a first master portion having a first capacitive element coupled to a first master data storage node;
a first slave portion having a first slave latch coupled between the first master storage node and a first slave data storage node;
a second master portion having a second capacitive element coupled to a second master data storage node;
a second slave portion having a second slave latch coupled between the second master storage node and a second slave data storage node, wherein:
during a first phase of a clock signal, the first master portion and the second master portion are in a hold phase in which the first and second capacitive elements are configured to store states of the first and second master storage nodes, and
during a second phase of the clock, the first master portion and the second master portion are in the transparent phase and the first slave portion and the second slave portion are in the hold phase.

17. The master slave storage of claim 16, further comprising:
a Muller gate having a first input coupled to the first slave storage node, a second input coupled to the second slave storage node, and an output coupled to an output of the master slave storage circuit; and
a keeper circuit having an input coupled to the output of the Muller gate.

18. The master slave storage of claim 17, further comprising:
a first switch coupled between the input of the master slave storage circuit and the first capacitive element;
a second switch coupled between the first master storage node and the first slave latch;
a third switch coupled between the input of the master slave storage circuit and the second capacitive; and
a fourth switch coupled between the second master storage node and the second slave latch, wherein, during the first phase of the clock signal, the first and third switches are closed and the second and fourth switches are open, and during the second phase of the clock signal, the first and third switches are open and the second and fourth switches are closed.

19. The master slave storage of claim 18, further comprising: a first inverter between the first capacitive element and the first master storage node; and a second inverter between the second capacitive element and the second master storage node, wherein the first and second inverters and the Muller gate are power gated elements, and the first and second slave latches and the keeper circuit are configured to receive a constant on power supply.

* * * * *